United States Patent
Haba et al.

(10) Patent No.: US 8,253,259 B2
(45) Date of Patent: *Aug. 28, 2012

(54) MICROELECTRONIC ASSEMBLY WITH IMPEDANCE CONTROLLED WIREBOND AND REFERENCE WIREBOND

(75) Inventors: Belgacem Haba, Saratoga, CA (US); Brian Marcucci, Phoenix, AZ (US)

(73) Assignee: Tessera, Inc., San Jose, CA (US)

( * ) Notice: Subject to any disclaimer, the term of this patent is extended or adjusted under 35 U.S.C. 154(b) by 8 days.

This patent is subject to a terminal disclaimer.

(21) Appl. No.: 12/722,799

(22) Filed: Mar. 12, 2010

(65) Prior Publication Data

US 2010/0232128 A1    Sep. 16, 2010

Related U.S. Application Data

(60) Provisional application No. 61/210,063, filed on Mar. 13, 2009.

(30) Foreign Application Priority Data

Sep. 22, 2009    (KR) .......................... 10-2009-0089471

(51) Int. Cl.
*H01L 21/306* (2006.01)
(52) U.S. Cl. ................................ 257/784; 257/E23.024
(58) Field of Classification Search .................. 257/784, 257/788, 690, E23.024, 724, 737
See application file for complete search history.

(56) References Cited

U.S. PATENT DOCUMENTS

| | | | |
|---|---|---|---|
| 4,680,613 A | 7/1987 | Daniels et al. | |
| 5,468,999 A | 11/1995 | Lin et al. | |
| 5,523,621 A | 6/1996 | Kikuchi | |
| 5,606,196 A | 2/1997 | Lee et al. | |
| 5,639,989 A | 6/1997 | Higgins, III | |
| 6,001,671 A | 12/1999 | Fjelstad | |
| 6,445,594 B1 | 9/2002 | Nakagawa et al. | |
| 6,476,506 B1 | 11/2002 | O'Connor et al. | |

(Continued)

FOREIGN PATENT DOCUMENTS

EP    0915504 A1    5/1999

(Continued)

OTHER PUBLICATIONS

U.S. Appl. No. 12/883,821.

(Continued)

*Primary Examiner* — Nathan Ha
(74) *Attorney, Agent, or Firm* — Lerner, David, Littenberg, Krumholz & Mentlik, LLP

(57) ABSTRACT

A microelectronic assembly can include a microelectronic device, e.g., semiconductor chip, connected together with an interconnection element, e.g., substrate, the latter having signal contacts and reference contacts. The reference contacts can be connectable to a source of reference potential such as ground or a voltage source other than ground such as a voltage source used for power. Signal conductors, e.g., signal wirebonds can be connected to device contacts exposed at a surface of the microelectronic device. Reference conductors, e.g., reference wirebonds can be provided, at least one of which can be connected with two reference contacts of the interconnection element. The reference wirebond can have a run which extends at an at least substantially uniform spacing from a signal conductor, e.g., signal wirebond that is connected to the microelectronic device over at least a substantial portion of the length of the signal conductor. In such manner a desired impedance may be achieved for the signal conductor.

23 Claims, 7 Drawing Sheets

U.S. PATENT DOCUMENTS

| | | |
|---|---|---|
| 6,538,336 B1 | 3/2003 | Secker et al. |
| 6,667,546 B2 | 12/2003 | Huang et al. |
| 6,770,822 B2 | 8/2004 | Pasternak et al. |
| 6,812,580 B1 | 11/2004 | Wenzel et al. |
| 7,217,997 B2 | 5/2007 | Wyland |
| 7,303,113 B2 | 12/2007 | Kwark et al. |
| 7,456,505 B2 | 11/2008 | Gospodinova et al. |
| 7,466,021 B2 | 12/2008 | Fjelstad |
| 7,468,560 B2 | 12/2008 | Guengerich et al. |
| 7,528,011 B2 | 5/2009 | Yano et al. |
| 7,537,962 B2 | 5/2009 | Jang et al. |
| 7,923,851 B2 | 4/2011 | Haba et al. |
| 2001/0015490 A1 | 8/2001 | Lee |
| 2003/0090001 A1 | 5/2003 | Beatson et al. |
| 2004/0164389 A1 | 8/2004 | Lee |
| 2005/0006742 A1 | 1/2005 | Sugiyama et al. |
| 2005/0098870 A1 | 5/2005 | Thomas et al. |
| 2005/0116013 A1 | 6/2005 | Kwark et al. |
| 2006/0049505 A1 | 3/2006 | Wyland |
| 2006/0125079 A1 | 6/2006 | Wyland et al. |
| 2006/0131742 A1 | 6/2006 | Tzu |
| 2006/0175712 A1 | 8/2006 | Lyn et al. |
| 2006/0180916 A1 | 8/2006 | Wyland |
| 2007/0105272 A1 | 5/2007 | Lee et al. |
| 2007/0170601 A1 | 7/2007 | Miyaki et al. |
| 2008/0088012 A1 | 4/2008 | Ohkawa |
| 2008/0111248 A1* | 5/2008 | Foong et al. .................. 257/778 |
| 2010/0230828 A1 | 9/2010 | Haba et al. |

FOREIGN PATENT DOCUMENTS

| | | |
|---|---|---|
| EP | 1770777 A2 | 4/2007 |
| JP | 7058138 A | 3/1995 |
| JP | 9-027512 A | 1/1997 |
| JP | 2000332160 A | 11/2000 |
| JP | 2001007140 A | 1/2001 |
| JP | 2004112143 A | 4/2004 |
| KR | 100270817 B1 | 11/2000 |
| KR | 20050002659 A | 1/2005 |
| KR | 100702970 A | 1/2007 |
| KR | 100935854 B1 | 1/2010 |
| KR | 100950511 B1 | 3/2010 |
| WO | 2008/008948 A2 | 1/2008 |
| WO | 2010020836 A1 | 2/2010 |

OTHER PUBLICATIONS

U.S. Appl. No. 12/883,811.
U.S. Appl. No. 12/883,556.
U.S. Appl. No. 12/883,612.
Partial International Search Report and Invitation to Pay Additional Fees, PCT/US2010/027141, dated Jan. 27, 2011.
Partial International Search Report and Invitation to Pay Additional Fees, PCT/US2010/027135, dated Mar. 21, 2011.
International Search Report Application No. PCT/US2010/027135, dated Aug. 30, 2011.
International Search Report, PCT/US2010/027141, dated Jan. 6, 2012.

* cited by examiner

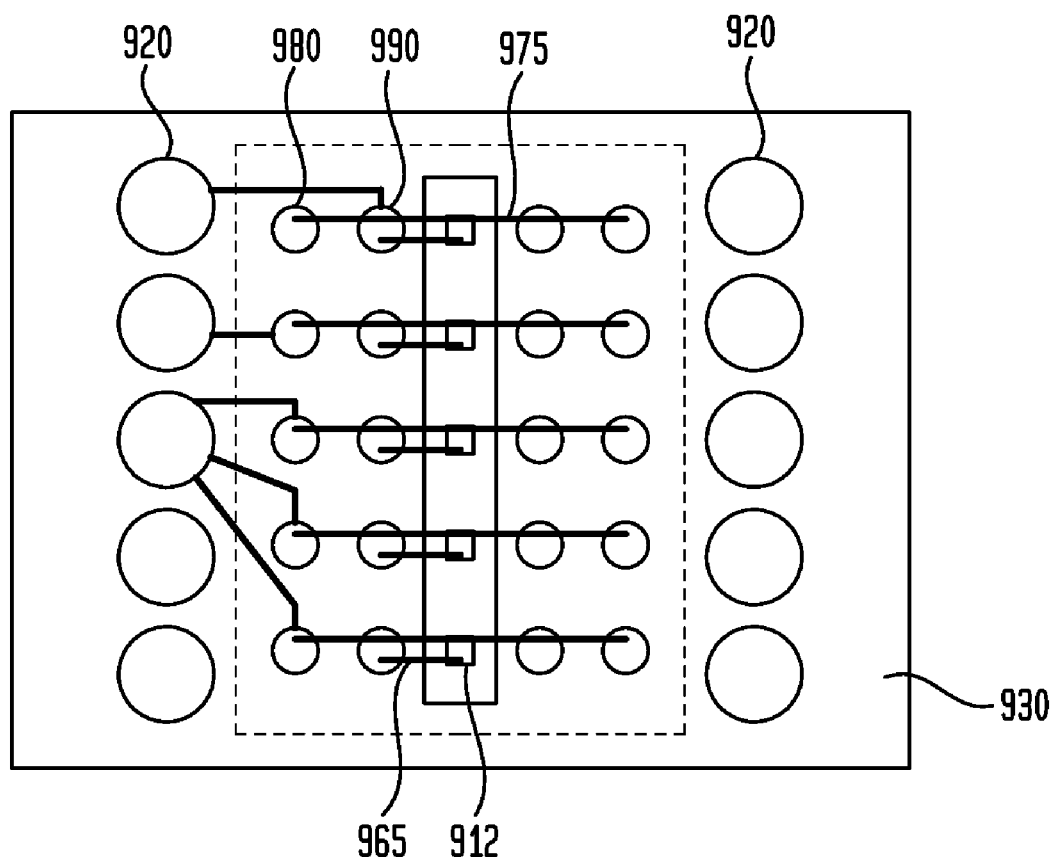

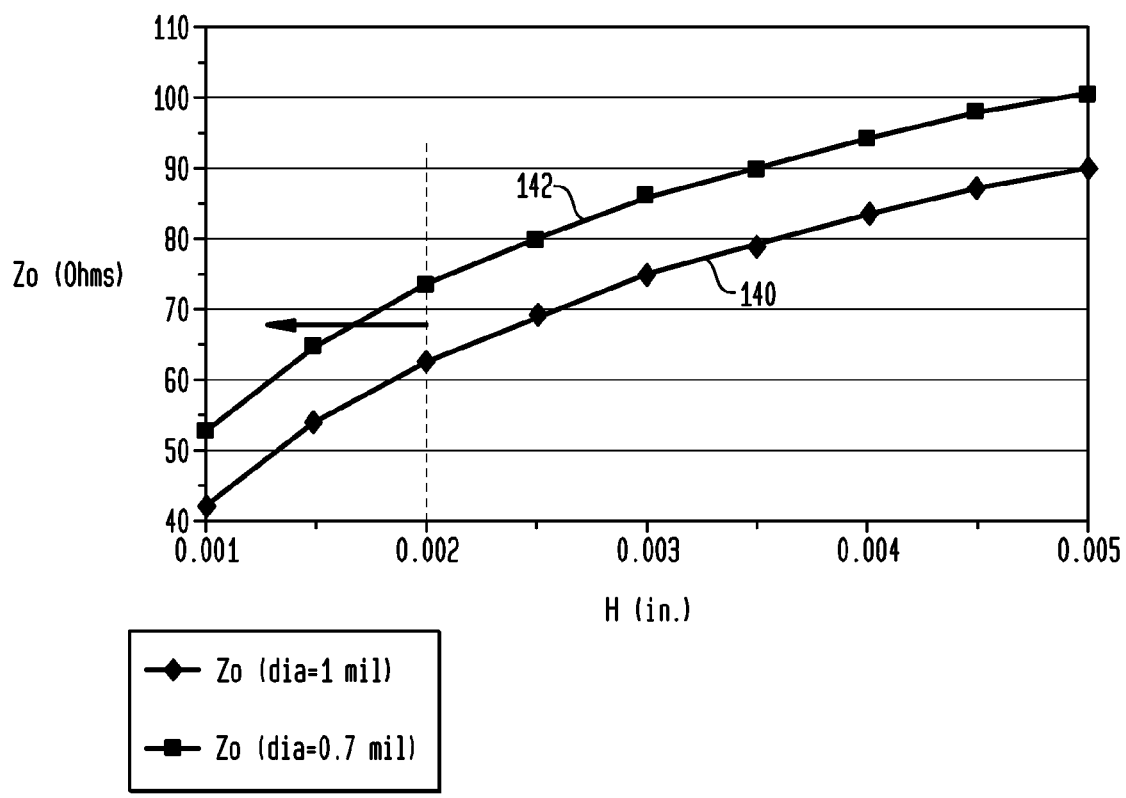

MICROELECTRONIC ASSEMBLY WITH IMPEDANCE CONTROLLED WIREBOND AND REFERENCE WIREBOND

CROSS REFERENCE TO RELATED APPLICATIONS

This application claims priority from Korean Application No. 10-2009-0089471 filed Sep. 22, 2009 and claims the benefit of U.S. Provisional Patent Application No. 61/210,063 filed Mar. 13, 2009, the disclosures of which are hereby incorporated herein by reference.

BACKGROUND

Microelectronic chips are typically flat bodies with oppositely facing, generally planar front and rear surfaces with edges extending between these surfaces. Chips generally have contacts, sometimes also referred to as pads or bond pads, on the front surface which are electrically connected to the circuits within the chip. Chips are typically packaged by enclosing them with a suitable material to form microelectronic packages having terminals that are electrically connected to the chip contacts. The package may then be connected to test equipment to determine whether the packaged device conforms to a desired performance standard. Once tested, the package may be connected to a larger circuit (e.g. a circuit in an electronic product such as a computer or a cell phone) by connecting the package terminals to matching lands on a printed circuit board (PCB) by a suitable connection method such as soldering.

Microelectronic packages may be fabricated at the wafer level; that is, the enclosure, terminations and other features that constitute the package, are fabricated while the chips, or die, are still in a wafer form. After the die have been formed, the wafer is subject to a number of additional process steps to form the package structure on the wafer, and the wafer is then diced to free the individually packaged die. Wafer level processing can be an efficient fabrication method because the footprint of each die package may be made identical, or nearly identical, to the size of the die itself, resulting in very efficient utilization of area on the printed circuit board to which the packaged die is attached.

A common technique for forming electrically conductive connections between a microelectronic chip and one or more other electronic components is through wire-bonding. Conventionally, a wirebonding tool attaches the end of a wire to a pad on a microelectronic chip using thermal and/or ultrasonic energy and then loops the wire to a contact on the other electronic component and forms a second bond thereto using thermal and/or ultrasonic forces.

SUMMARY

The inventors have recognized that one of the problems with wire-bond technology is that electromagnetic transmissions along a wire can extend into space surrounding the wire, inducing currents in nearby conductors and causing unwanted radiation and detuning of the line. Wire-bonds generally are also subject to self-inductances and are subject to external noise (e.g. from nearby electronic components). In the end, this creates electrical impedance problems. These problems can become more serious as the pitch between contacts on microelectronic chips and other electronic components becomes smaller, as the chips operate at higher frequencies, and as the use of multiple raw pads becomes more common.

Various structures and techniques for manufacturing are described herein for a microelectronic assembly. A microelectronic assembly, in accordance with an embodiment, includes a microelectronic device wire-bonded to one or more microelectronic subassemblies.

Accordingly, a microelectronic assembly is provided which includes a microelectronic device, e.g., a semiconductor chip or semiconductor chip having additional structure connected thereto, conductively connected with a microelectronic subassembly, e.g., an interconnection element such as a substrate, carrier, etc. The microelectronic assembly can include reference conductors or reference conductive elements, e.g., wirebonds. One of the reference conductors, e.g., wirebonds can be connected with two reference contacts on the microelectronic subassembly. The reference contacts can be connectable to a source of reference potential such as ground or a voltage source other than ground such as a voltage source used for power. Alternatively, the reference contacts can be connectable to a source of potential which appears stable in relation to frequencies of interest for signals which can be input or output to the microelectronic device on at least particular signal conductors connected to the microelectronic device. The reference wirebond can have a run which extends at an at least substantially uniform spacing to a run of a signal conductor, e.g., signal wirebond, connected to the microelectronic device, over at least a substantial portion of the length of the signal conductor. The reference conductor can be appropriately spaced from the signal conductor so as to achieve a desired impedance for the signal conductor.

According to an embodiment herein, a microelectronic assembly is provided which includes a microelectronic device having a device contacts exposed at a surface thereof. An interconnection element can have a plurality of signal contacts and a plurality of reference contacts, the reference contacts being connectable to a source of reference potential for connection to a reference potential. Signal conductors may connect particular device contacts with the signal contacts. The signal conductors may have substantial portions extending in runs above the surface of the microelectronic device. A plurality of reference conductors can be connected to the reference contacts. The reference conductors may have substantial portions extending in runs spaced at an at least substantially uniform spacing from the runs of the signal conductors. At least one of the reference conductors may be connected to two reference contacts of the interconnection element. In accordance with such embodiment, a desired impedance may be achieved for the signal conductors.

According to an embodiment herein, the reference conductors may extend at least substantially in parallel with appreciable portions of the runs of the signal conductors. In a particular embodiment, the reference conductors can be disposed above the signal conductors, below the signal conductors, or can be disposed above and below the signal conductors.

In accordance with a particular embodiment, the runs of at least some of the signal conductors can extend in a first plane. One or more of the reference conductors can have appreciable portions extending in a second plane which is at least substantially parallel to the first plane.

In accordance with a particular embodiment appreciable portions of the reference conductors can extend at least substantially parallel to the runs of the signal conductors. Such portions of the reference conductors may extend so over at least about 50% of the length of the runs of the signal conductors.

In accordance with a particular embodiment, the signal conductors can include signal bond wires and the reference conductors can include reference bond wires. In a particular embodiment, the signal conductors can be signal bond wires and the reference conductors can be reference bond wires. In such case, at least one of the reference bond wires can be bonded to two reference contacts of the interconnection element.

In accordance with a particular embodiment, the reference bond wires can include first reference bond wires disposed at a greater height from the microelectronic device than the signal bond wires. Second reference bond wires may also be provided, such second reference bond wires being disposed at a lower height from the microelectronic device than the signal bond wires. The reference bond wires may also include third reference bond wires interposed between individual ones of the signal bond wires.

In accordance with a particular embodiment, the reference bond wires have first ends and second ends remote from the first ends. At least one of the reference bond wires can have a first end connected to a reference contact and a second end connected to a device contact.

In accordance with a particular embodiment, the surface of the microelectronic device at which the device contacts are exposed can be a front surface, and the microelectronic device can have a rear surface that is remote from the front surface, and edges can extend between the front and rear surfaces. The rear surface may be mounted to the interconnect element and, in such case, the signal bond wires and reference bond wires may extend beyond the edges of the microelectronic device.

In accordance with a particular embodiment, the reference bond wires can have runs which are canted at an angle with respect to the surface of the microelectronic device.

In accordance with a particular embodiment, the plurality of runs of the signal conductors can include at least portions of bond wires.

In accordance with a particular embodiment, one or more of the signal bond wires can extend in a stepwise manner as a plurality of connected steps. At least one of the reference bond wires may extend in a stepwise manner at an at least substantially uniform spacing from at least some steps of such signal bond wire.

BRIEF DESCRIPTION OF THE DRAWINGS

FIG. 1C is a plan view further illustrating a microelectronic assembly in accordance with an embodiment herein.

FIG. 1D is a graph illustrating a relationship of separation distance H between a signal conductor and ground and characteristic impedance.

DETAILED DESCRIPTION

Figure 1A:
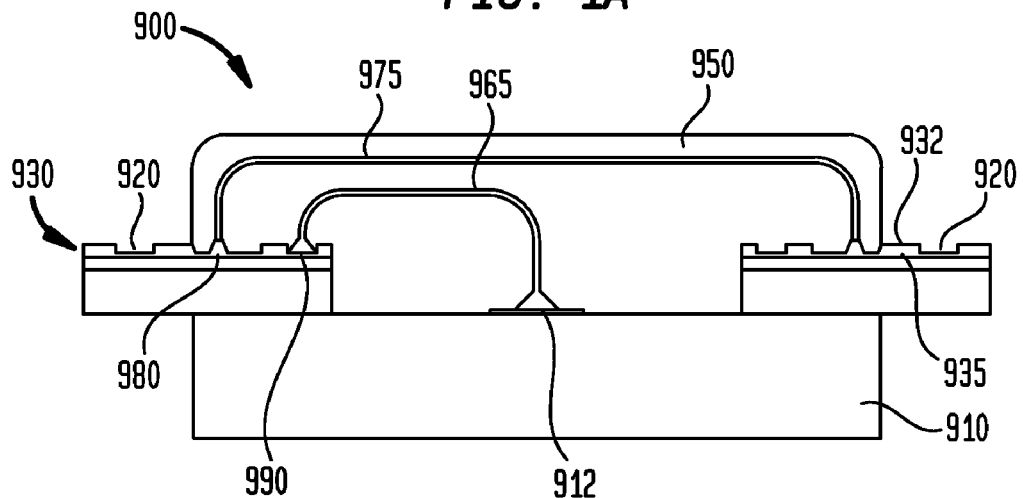
FIG. 1A is a sectional view illustrating a microelectronic assembly in accordance with an embodiment herein.
Figure 1B:
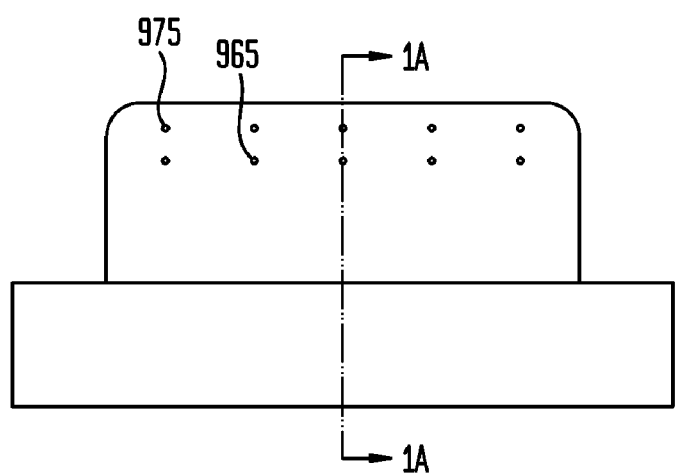
FIG. 1B is a sectional view along a section line transverse to the section illustrated in FIG. 1A and further illustrating a microelectronic assembly in accordance with an embodiment herein.

FIG. 1A is an elevational view of a microelectronic assembly 900 in accordance with an embodiment. FIG. 1B is a corresponding sectional view of the microelectronic assembly 900 through a line transverse to the direction in which section illustrated in FIG. 1A, and FIG. 1C is a top-down plan view from above the microelectronic subassembly 930.

In this example, microelectronic assembly 900 includes a microelectronic device 910 having conductive interconnections such as through wire-bonds to microelectronic subassembly 930, e.g., an element having an interconnection function, also referred to herein as an interconnection element. The wire-bonds may be formed using conventional wire-bonding techniques. For explanation purposes, microelectronic device 910 can be a single "bare", i.e., unpackaged die, e.g., a semiconductor chip having microelectronic circuitry thereon. In alternative embodiments, microelectronic device 910 can include a packaged semiconductor die.

For ease of reference, directions are stated in this disclosure with reference to a "top", i.e., contact-bearing surface 928 of a semiconductor chip 910. Generally, directions referred to as "upward" or "rising from" shall refer to the direction orthogonal and away from the chip top surface 928. Directions referred to as "downward" shall refer to the directions orthogonal to the chip top surface 128 and opposite the upward direction. The term "above" a reference point shall refer to a point upward of the reference point, and the term "below" a reference point shall refer to a point downward of the reference point. The "top" of any individual element shall refer to the point or points of that element which extend furthest in the upward direction, and the term "bottom" of any element shall refer to the point or points of that element which extend furthest in the downward direction.

Microelectronic subassembly 930, as shown in FIG. 1A, has an interconnection function. For example, the microelectronic subassembly can be an element of a package having a plurality of conductive leads or traces 935, a plurality of signal contacts 990 connected to the leads or traces arranged generally at first locations for interconnection with the microelectronic device, a plurality of terminals 920 arranged generally at second locations, for example, for interconnection to another element such as for external interconnection to a printed circuit board, and a plurality of reference contacts 980 which are connectable (such as through terminals 920) with a source of power or ground. In the example illustrated in FIGS. 1A-C, contacts 990 can carry signals, i.e., voltages or currents which vary with time and which typically convey information. For example, without limitation, voltages or currents which vary with time and which represent state, change, a measurement, a clock or timing input or a control or feedback input are examples of signals. On the other hand, the reference contacts 990 can provide connections to ground or a power supply voltage. A connection to ground or a power supply voltage typically provides a reference in a circuit to a voltage which is at least fairly stable with time over frequencies of interest to the operation of the circuit.

As used in this disclosure, a statement that an electrically conductive structure is "exposed at" a surface of a dielectric structure indicates that the electrically conductive structure is available for contact with a theoretical point moving in a direction perpendicular to the surface of the dielectric structure toward the surface of the dielectric structure from outside the dielectric structure. Thus, a terminal or other conductive structure which is exposed at a surface of a dielectric structure may project from such surface; may be flush with such surface; or may be recessed relative to such surface and exposed through a hole or depression in the dielectric.

In one particular embodiment, the microelectronic subassembly can include a "substrate", e.g., a dielectric element bearing a plurality of traces and bond pads. Without limitation, one particular example of a substrate can be a sheet-like flexible dielectric element, typically made of a polymer, e.g., polyimide, among others, having metal traces and bond pads patterned thereon, the bond pads being exposed at at least one face of the dielectric element.

Prior to forming conductive interconnections between the microelectronic device and the microelectronic subassembly, pads 980, 990 are exposed at an outwardly-directed face 932 of a microelectronic subassembly 130. As particularly shown in FIGS. 1A-C, a transmission line can be formed by a signal wire bond 965 which is juxtaposed in a parallel or substantially parallel run with a reference wirebond 975 over at least a substantial portion of the length of the signal wirebond. The signal wirebond conductively connects a device contact 912 at a surface (typically a front surface) of the microelectronic device 910 with an element contact 975 exposed at a surface of the microelectronic subassembly 930. In one embodiment, the runs of the signal wirebond and reference wirebond can be parallel or substantially parallel over more than 50% of the length of the signal wirebond.

The reference wirebond is connected at both ends to ground contacts 980 on the microelectronic subassembly 930 or is connected at both ends to power contacts on the microelectronic subassembly 930. As shown, the reference wirebond 975 overlies the signal wirebond and is insulated therefrom by a dielectric material, e.g., an encapsulant which can be formed by dispensing a glob of dielectric material over the wirebonds 965, 975 and thereafter curing the material. Wirebonds can be formed with relatively precise placement and within desirable tolerances such that parallel, closely spaced runs can be achieved. For example, wirebonding equipment available from Kulicke and Soffa can be used to achieve precision wirebonds.

In order to achieve a selected characteristic impedance in the so-formed transmission lines, parameters can be selected such as the conductive properties of the metal used in the wirebonds 965, 975, as well as the shape and thicknesses of the wires therein, the thickness of the insulating material 950 between the wirebonds and the dielectric constant of the insulating material 950. In a particular embodiment, the runs of the reference wirebonds are disposed a spaced distance from the runs of the signal wirebonds. In one embodiment, such distance can be selected to be about 50 micrometers (microns). In another embodiment, such distance can be selected to be greater, such as 75 microns, 100 microns or greater.

FIG. 1D graphs characteristic impedance $Z_0$, in ohms, versus separation distance, in inches, between a signal conductor, e.g., a wire of cylindrical cross-section, and a reference conductor, e.g., "ground plane". The reference conductor is assumed to be a planar structure that is large in comparison with the diameter of the signal conductor. FIG. 1D plots characteristic impedance for two different diameter wires. The plots in FIG. 1D can be derived from an equation that governs characteristic impedance in an arrangement having the present geometry. In such equation, the characteristic impedance $Z_0$ is given by $$Z_0 = \frac{138 \times \log(4H/d)}{\sqrt{\varepsilon_R}} \text{ ohms,}$$

where H is the separation distance between the wire and the conductive plane, d is the diameter of the wire and $\varepsilon_R$ is the permeability of the dielectric material that separates the wire from the conductive plane. In FIG. 1B, the lower curve 140 plots the characteristic impedance when the wire has a thickness of 1 mil, i.e., 0.001 inch. The upper curve 142 plots the characteristic impedance when the wire has a thickness of 0.7 mil, i.e., 0.0007 inch. As seen in FIG. 1D, characteristic impedances lower than about 70 ohms are provided when a separation distance H between the wire and the conductive plane is less than or equal to about 0.002 inch (2 mils).

Figure 2A:
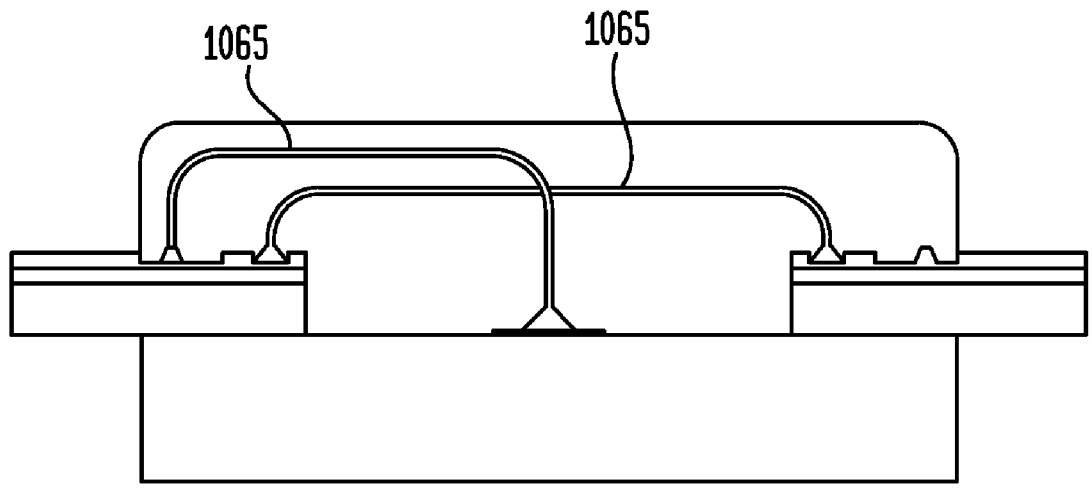
FIG. 2A is a sectional view illustrating a microelectronic assembly in accordance with an embodiment herein.
Figure 2B:
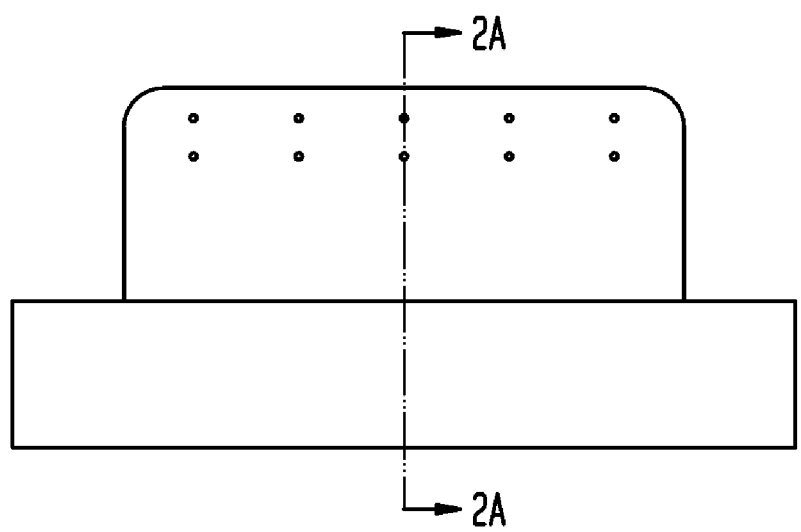
FIG. 2B is a sectional view along a section line transverse to the section illustrated in FIG. 2A and further illustrating a microelectronic assembly in accordance with an embodiment herein.

FIGS. 2A and 2B are an elevational view and a corresponding sectional view of a microelectronic assembly 1000 according to another embodiment. Here, as particularly shown, the signal wirebond 1065 can overlie the reference wirebond, e.g., a ground wirebond 1075.

Figure 3:
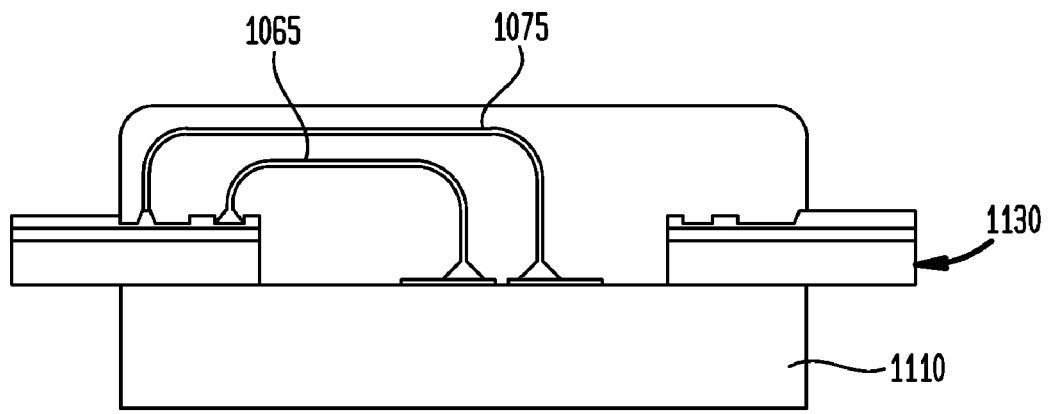
FIG. 3 is a sectional view illustrating a microelectronic assembly in accordance with an embodiment herein.

As particularly shown in the elevational view provided in FIG. 3, each of the signal wirebond 1165 and reference wirebond 1175 of a transmission line can extend between a contact of the microelectronic device 1110 and a contact of the microelectronic subassembly 1130.

Figure 4:
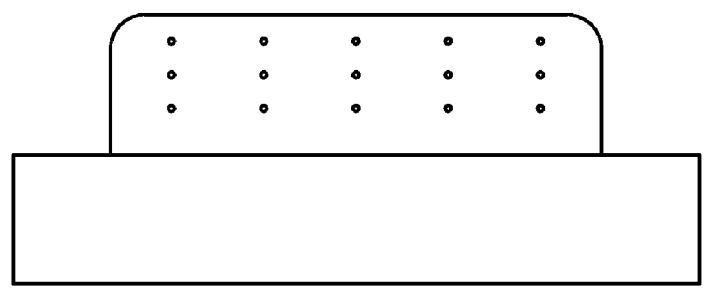
FIG. 4 is a sectional view illustrating a microelectronic assembly in accordance with an embodiment herein.

As illustrated in the sectional view of FIG. 4, any manner of placement of signal wirebonds can be used to form transmission lines. For example, a reference wirebond can be disposed either over or under or in between signal wirebonds, or laterally adjacent to the signal wirebonds. Moreover, multiple reference wirebonds can function as reference conductors for a particular signal wirebond.

Figure 5:
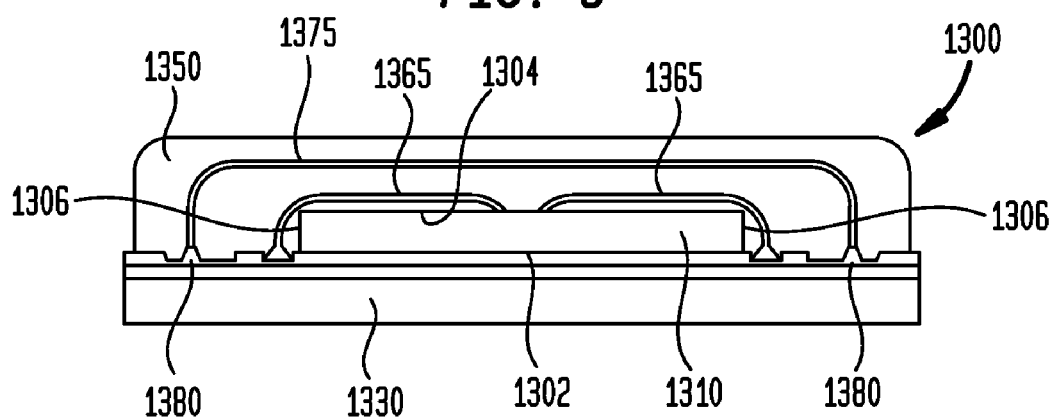
FIG. 5 is a sectional view illustrating a microelectronic assembly in accordance with an embodiment herein.

FIG. 5 is an elevational view illustrating a microelectronic assembly 1300. Here, the reference conductor of a transmission line is provided by a reference wirebond 1375 having ends conductively connected to either pairs of ground contacts or to pairs of power contacts on the microelectronic subassembly. The reference wirebond 1375 can function as a reference conductor for one or a plurality of signal wirebonds 1365. As illustrated in FIG. 5, there are two such signal wirebonds which extend in close proximity to reference wirebond 1375.

In a particular embodiment, a plurality of microelectronic assemblies similar to those shown in FIG. 5 can be stacked one on top of the other and be conductively and mechanically connected together to form an operational unit. A process of forming such unit can begin with the formation of a microelectronic assembly including a microelectronic device connected thereto with signal conductive elements and reference conductive elements. To form such assembly, signal conductive elements (e.g., wire bonds) 1365 can be formed which connect the microelectronic device 1310 with a corresponding microelectronic subassembly 1330, e.g., a substrate, carrier, or tape underlying the rear surface 1302 of the microelectronic device. Reference conductive elements (e.g., wire bonds) 1375 can be formed which connect respective contacts 1380 on the interconnect element 1330. Then, the dielectric layer (e.g., encapsulant layer) 1350 can be formed in a manner so as to encapsulate those portions of the signal conductive elements and the reference conductive elements which overlie the front surface 1304 of the microelectronic device, leaving at least some of the reference contacts and signal contacts on the microelectronic subassembly exposed beyond the edges 1306 of the microelectronic device 1310. A plurality of such microelectronic assemblies fabricated in such manner can be stacked one on top of another and conductors can then be formed which connect together at least some of the reference contacts and signal contacts on each microelectronic assembly.

Figure 6:
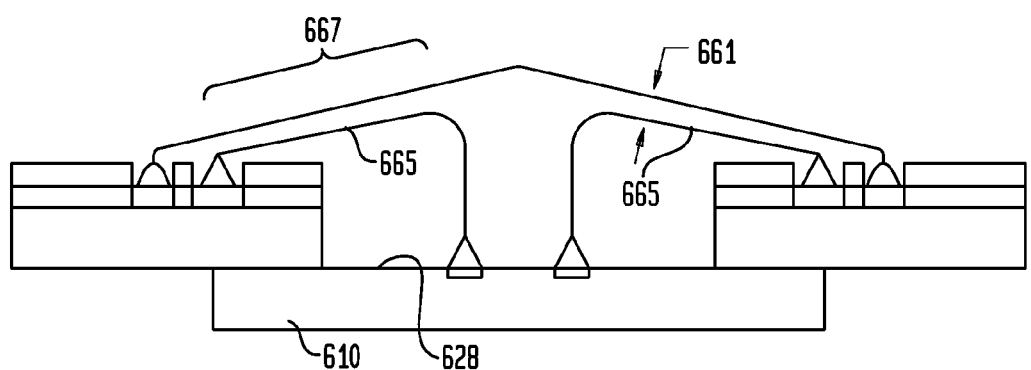
FIG. 6 is a sectional view illustrating a microelectronic assembly in accordance with an embodiment herein.

FIG. 6 illustrates a variation of the above embodiment (FIGS. 1A-C) in which signal wires 665 extend in runs along the surface 628 of the microelectronic device 610, where the runs 667 are not parallel to the plane of the surface 628. Instead, the runs 667 of the wire bonds are canted at an angle relative to the surface 628. In this case, a reference bond wire 675 can extend parallel to the runs 667 at a spacing 661 which is uniform or at least substantially uniform along 50% or more of the length of the signal wire bond. In this way, a transmission line structure is achieved which has a beneficial characteristic impedance. The fabrication method can be the same as described with respect to FIGS. 1A-B above, except that the wirebonding equipment is configured, e.g., programmed differently, to produce wirebonds having shape as seen in FIG. 6.

Figure 7:
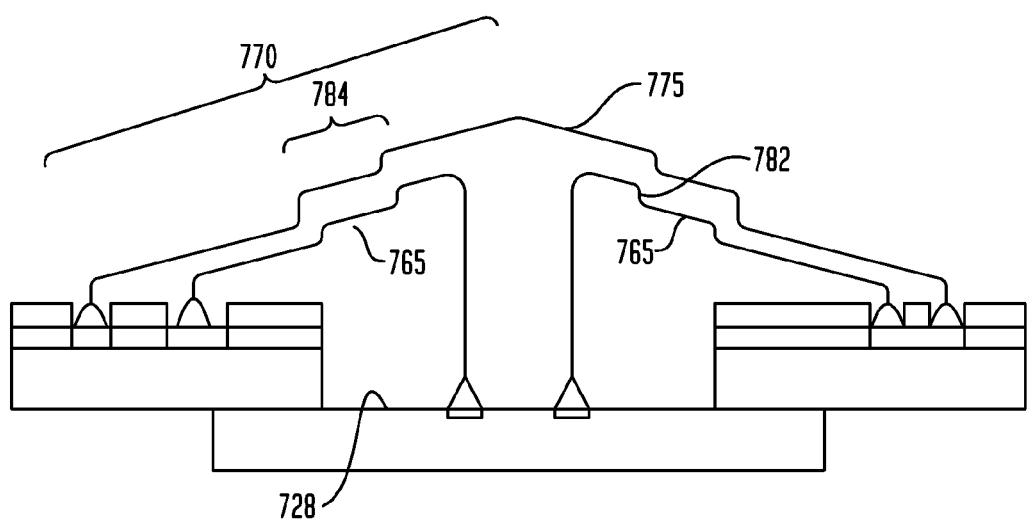
FIG. 7 is a sectional view illustrating a microelectronic assembly in accordance with an embodiment herein.

FIG. 7 illustrates yet another variation in which the wire bonds 765 do not extend in uniformly linear runs. Instead, the wire bonds have a stair-step shape that includes first jogs 782, which can be relatively short and extend mostly in a vertical direction relative to the surface 728, and second jogs 784, which can be somewhat longer than the first jogs 782 and can extend in directions across the surface 728 of the microelectronic device 710. The reference wirebond 775 can also be arranged to have a stair-step shaped run 770 so as to follow the contours of the signal wirebonds. As a result, the reference wirebond 775 can extend parallel to the jogs 784 of the wirebonds at a spacing 781 which is uniform or at least substantially uniform along 50% or more of the length of the wire bonds. Again, the same fabrication as described with respect to FIGS. 1A-B above can be used to form the assembly shown in FIG. 7, except that the wirebonding equipment is configured, e.g., programmed differently, to produce wirebonds having shape as seen in FIG. 7.

The foregoing embodiments have been described with respect to the interconnection of individual microelectronic devices, e.g., semiconductor chips. However, it is contemplated that the methods described herein may be employed in a wafer-scale manufacturing process applied simultaneously to a plurality of chips connected together at edges of the chips, such as a plurality of chips connected together at edges in form of a unit, panel, wafer or portion of a wafer.

While the above description makes reference to illustrative embodiments for particular applications, it should be understood that the claimed invention is not limited thereto. Those having ordinary skill in the art and access to the teachings provided herein will recognize additional modifications, applications, and embodiments within the scope of the appended claims.

The invention claimed is:

1. A microelectronic assembly comprising:
a microelectronic device having device contacts exposed at a surface thereof;
an interconnection element having a plurality of signal contacts and a plurality of reference contacts, the reference contacts being connectable to a source of reference potential;
signal conductors connecting the device contacts with the signal contacts, the signal conductors having substantial portions extending in runs above the surface of the microelectronic device; and
reference conductors connected to the reference contacts and having substantial portions extending in runs spaced at an at least substantially uniform spacing from the runs of the signal conductors, at least one of the reference conductors being connected to two reference contacts of the interconnection element, such that a desired impedance is achieved for the signal conductors.

2. A microelectronic assembly comprising:
a microelectronic device having device contacts on a surface thereof;
an interconnection element having a plurality of signal contacts and a plurality of reference contacts, the reference contacts being connectable to a source of reference potential;
signal conductors connecting the device contacts with the signal contacts, the signal conductors having substantial portions extending in runs above the surface of the microelectronic device; and
reference conductors connected to the reference contacts and extending at least substantially in parallel with appreciable portions of the runs of the signal conductors, the reference conductors being disposed at least one of above the signal conductors or below the signal conductors, at least one of the reference conductors being connected to two reference contacts of the interconnection element, such that a desired impedance is achieved for the signal conductors.

3. A microelectronic assembly as claimed in claim 1 or claim 2, wherein the runs of at least some of the signal conductors extend in a first plane and at least some of the reference conductors have appreciable portions extending in a second plane which is at least substantially parallel to the first plane.

4. A microelectronic assembly as claimed in claim 1 or claim 2, wherein appreciable portions of the reference conductors extend at least substantially parallel to the runs of the signal conductors over at least about 50% of the length of the runs of the signal conductors.

5. A microelectronic assembly as claimed in claim 1 or claim 2, wherein the signal conductors include signal bond wires and the reference conductors include reference bond wires.

6. A microelectronic assembly as claimed in claim 1 or claim 2, wherein the signal conductors are signal bond wires and the reference conductors are reference bond wires.

7. A microelectronic assembly as claimed in claim 6, wherein at least one of the reference bond wires is bonded to respective reference contacts of the interconnection element.

8. A microelectronic assembly as claimed in claim 1, wherein the reference bond wires include first reference bond wires disposed at a greater height from the microelectronic device than the signal bond wires, second reference bond wires disposed at a lower height from the microelectronic device than the signal bond wires, and third reference bond wires interposed between individual ones of the signal bond wires.

9. A microelectronic assembly as claimed in claim 5, wherein the reference bond wires have first ends and second ends remote from the first ends, at least one of the reference bond wires having a first end connected to a reference contact and a second end connected to a device contact.

10. A microelectronic assembly as claimed in claim 6, wherein the surface is a front surface, the microelectronic device has a rear surface remote from the front surface and edges extending between the front and rear surfaces, the rear surface being mounted to the interconnect element such that the signal bond wires and reference bond wires extend beyond the edges of the microelectronic device.

11. A microelectronic assembly as claimed in claim 6, wherein at least some of the runs are canted at an angle relative to the surface of the microelectronic device.

12. A microelectronic assembly as claimed in claim 5, wherein the plurality of runs includes at least portions of bond wires.

13. A microelectronic assembly as claimed in claim 12, wherein at least one of the signal bond wires extends in a stepwise manner as a plurality of connected steps, and at least one of the reference bond wires extends in a stepwise manner at an at least substantially uniform spacing from at least some steps of such signal bond wire.

14. A microelectronic assembly as claimed in claim 13, wherein the runs of at least some of the signal conductors extend in a first plane and at least some of the reference conductors have appreciable portions extending in a second plane which is at least substantially parallel to the first plane.

15. A microelectronic assembly as claimed in claim 13, wherein appreciable p ortions of the reference conductors extend at least substantially parallel to the runs of the signal conductors over at least about 50% of the length of the runs of the signal conductors.

16. A microelectronic assembly as claimed in claim 13, wherein the signal conductors include signal bond wires and the reference conductors include reference bond wires.

17. A microelectronic assembly as claimed in claim 13, wherein the signal conductors are signal bond wires and the reference conductors are reference bond wires.

18. A microelectronic assembly as claimed in claim 17, wherein at least one of the reference bond wires is bonded to respective reference contacts of the interconnection element.

19. A microelectronic assembly as claimed in claim 16, wherein the reference bond wires have first ends and second ends remote from the first ends, at least one of the reference bond wires having a first end connected to a reference contact and a second end connected to a device contact.

20. A microelectronic assembly as claimed in claim 17, wherein the surface is a front surface, the microelectronic device has a rear surface remote from the front surface and edges extending between the front and rear surfaces, the rear surface being mounted to the interconnect element such that the signal bond wires and reference bond wires extend beyond the edges of the microelectronic device.

21. A microelectronic assembly as claimed in claim 17, wherein at least some of the runs are canted at an angle relative to the surface of the microelectronic device.

22. A microelectronic assembly as claimed in claim 16, wherein the plurality of runs includes at least portions of bond wires.

23. A microelectronic assembly as claimed in claim 22, wherein at least one of the signal bond wires extends in a stepwise manner as a plurality of connected steps,

\* \* \* \* \*

UNITED STATES PATENT AND TRADEMARK OFFICE
CERTIFICATE OF CORRECTION

PATENT NO. : 8,253,259 B2
APPLICATION NO. : 12/722799
DATED : August 28, 2012
INVENTOR(S) : Belgacem Haba and Brian Marcucci It is certified that error appears in the above-identified patent and that said Letters Patent is hereby corrected as shown below:

In the claims:

Column 8, lines 24 and 25, delete "or claim 2".
Column 8, lines 30 and 31, delete "or claim 2".
Column 8, lines 35 and 36, delete "or claim 2".
Column 8, lines 39 and 40, delete "or claim 2".
Column 9, line 10, delete "13" and insert --2--.
Column 9, line 16, delete "13" and insert --2--.
Column 9, line 17, delete "p ortions" and insert --"portions--.
Column 9, line 21, delete "13" and insert --2--.
Column 9, line 24, delete "13" and insert --2--.

Signed and Sealed this
Thirty-first Day of December, 2013

Margaret A. Focarino
*Commissioner for Patents of the United States Patent and Trademark Office*